(12) United States Patent
Cheng et al.

(10) Patent No.: US 12,364,119 B2
(45) Date of Patent: Jul. 15, 2025

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yudiao Cheng, Beijing (CN); Xilei Cao, Beijing (CN); Benlian Wang, Beijing (CN); Qiwei Wang, Beijing (CN); Zhenhua Zhang, Beijing (CN); Yuxin Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 98 days.

(21) Appl. No.: 17/791,649

(22) PCT Filed: Apr. 30, 2021

(86) PCT No.: PCT/CN2021/091232
§ 371 (c)(1),
(2) Date: Jul. 8, 2022

(87) PCT Pub. No.: WO2022/226950
PCT Pub. Date: Nov. 3, 2022

(65) Prior Publication Data
US 2024/0196682 A1  Jun. 13, 2024

(51) Int. Cl.
*H10K 59/131* (2023.01)
*H10K 59/80* (2023.01)

(52) U.S. Cl.
CPC ....... *H10K 59/131* (2023.02); *H10K 59/1315* (2023.02); *H10K 59/8051* (2023.02)

(58) Field of Classification Search
CPC ............ H10K 59/131; H10K 59/1315; H10K 59/8051
(Continued)

(56) References Cited

U.S. PATENT DOCUMENTS

2016/0343980 A1* 11/2016 Lee ................... H10K 50/8426
2018/0006105 A1   1/2018 Kim et al.
(Continued)

FOREIGN PATENT DOCUMENTS

CN       107564938 A    1/2018
CN       109449196 A    3/2019
(Continued)

OTHER PUBLICATIONS

CN 202180001046.3 second office action.
PCT/CN2021/091232 international search report and written opinion.

*Primary Examiner* — Xia L Cross
(74) *Attorney, Agent, or Firm* — IPro, PLLC

(57) ABSTRACT

A display substrate and a display device are provided. The display substrate includes: display region and peripheral region surrounding display region; display region includes at least one group of pixel regions including first pixel region and two second pixel regions, first pixel region is between two second pixel regions along first direction; peripheral region includes fan-out region on a side of first pixel region in second direction, second direction intersects with first direction; in display substrate, at least part of first data line is in first pixel region, first data line includes a part extending along second direction; at least part of second data line is in second pixel region, second data line includes a part extending along second direction; connecting line is coupled to corresponding second data line, connecting line includes a
(Continued)

portion in first pixel region, connecting line extends from first pixel region to fan-out region.

20 Claims, 9 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2019/0189232 A1* | 6/2019 | Wang | G09G 3/20 |
| 2020/0183240 A1 | 6/2020 | Hsieh et al. | |
| 2020/0295117 A1* | 9/2020 | Park | H10K 59/1315 |
| 2022/0336542 A1 | 10/2022 | Chen et al. | |

FOREIGN PATENT DOCUMENTS

| | | |
|---|---|---|
| CN | 110297370 A | 10/2019 |
| CN | 111463255 A | 7/2020 |
| CN | 211348942 U | 8/2020 |
| CN | 111933674 A | 11/2020 |

* cited by examiner

DISPLAY SUBSTRATE AND DISPLAY DEVICE

CROSS-REFERENCE TO RELATED APPLICATION

This application is the U.S. national phase of PCT Application No. PCT/CN2021/091232 filed on Apr. 30, 2021, which is incorporated in its entirety by reference herein.

TECHNICAL FIELD

The present disclosure relates to the field of display technology, and more particularly, to a display substrate and a display device.

BACKGROUND

Organic light-emitting diode (OLED) display devices, which have advantages such as low power consumption, wide color gamut and large size, have attracted extensive attention and are considered as the next generation display technology to replace liquid crystal. Moreover, as the demand for display performance of OLED display devices continues to increase, narrow-border and multi-form OLED display devices are becoming increasingly desirable.

SUMMARY

The object of the present disclosure is to provide a display substrate and a display device.

In order to achieve the above object, the present disclosure provides the following technical solutions.

A first aspect of the present disclosure provides a display substrate, including: a display region and a peripheral region surrounding the display region; where the display region includes at least one group of pixel regions, the group of pixel regions includes a first pixel region and two second pixel regions, and the first pixel region is located between the two second pixel regions in a first direction; where the peripheral region includes a fan-out region, the fan-out region is located at a side of the first pixel region in a second direction, and the second direction intersects with the first direction; where the display substrate further includes:
  multiple first data lines, where at least part of the first data line is located in the first pixel region, and the first data line includes a part extending along the second direction;
  multiple second data lines, where at least part of the second data line is located in the second pixel region, and the second data line includes a part extending along the second direction; and
  multiple connecting lines, where the connecting line is coupled with the corresponding second data line, the connecting line includes a portion located at the first pixel region, and the connecting line extends from the first pixel region to the fan-out region.

Optionally, the connecting line includes a first connecting portion and a second connecting portion coupled to each other;
  the first connecting portion includes a portion extending along the first direction, and the first connecting portion is coupled with the corresponding second data line; and
  the second connecting portion includes a portion extending along the second direction, at least part of the second connecting portion is located in the first pixel region, and the second connecting portion extends from the first pixel region to the fan-out region.

Optionally, the multiple first connecting portions included in the multiple connecting lines are arranged in the second direction, and two adjacent first connecting portions of the multiple first connecting portions have substantially the same length; and/or,
  the multiple second connecting portions included in the multiple connecting lines are arranged in the first direction, and two adjacent second connecting portions of the multiple second connecting portions have substantially the same length.

Optionally, the first data line and the second data line are arranged in a same layer and made of a same material, the first connecting portion is located on a side of the second data line facing away from a base of the display substrate, and the second connecting portion is located on a side of the first connecting portion facing away from the base.

Optionally, the first connecting portion includes a first sub-portion and a second sub-portion coupled with each other;
  the first sub-portion includes a portion extending along the second direction, and the first sub-portion is coupled with the corresponding second data line; and
  the second sub-portion includes a portion extending along the first direction, the second sub-portion is coupled to the second connecting portion.

Optionally, the first sub-portion traverses the display region in the second direction, the first sub-portion includes at least one first sub-segment, two ends of the first sub-segment are coupled to the corresponding second data line, and the second sub-portion is coupled to one first sub-segment of the at least one first sub-segment; and
  in a case that the first sub-portion includes multiple first sub-segments, there is a gap between adjacent first sub-segments, and a second sub-portion included in another first connecting portion traverses the gap.

Optionally, the first connecting portion and the second connecting portion are arranged in a same layer and made of a same material, and the first connecting portion is arranged in a different layer from the second data line.

Optionally, the first sub-portion and the corresponding second data line are coupled through at least one via hole; in a case that the first sub-portion and the corresponding second data line are coupled through multiple via holes, the multiple via holes are arranged along the second direction.

Optionally, the first data line extends from the first pixel region to the fan-out region.

Optionally, the display substrate further includes:
  multiple first extension lines, where the first extension line is coupled to the corresponding first data line, the first extension line extends from the first pixel region to the fan-out region, and the first extension line and the second connecting portion are arranged in a same layer and made of a same material.

Optionally, the display substrate further includes:
  multiple compensation lines, where the compensation line includes a portion located in the first pixel region, and the compensation line is coupled to the corresponding first data line.

Optionally, a length of the compensation line is substantially the same as a length of the adjacent first connecting portion.

Optionally, the multiple compensation lines includes multiple first compensation lines, the first compensation line includes a portion extending in the first direction, the first compensation lines are spaced apart from the first connecting portions in the second direction.

Optionally, the compensation line and the first connecting portion are in a same layer and made of a same material.

Optionally, the multiple compensation lines includes multiple second compensation lines, the second compensation line traverses the display region in the second direction, the second compensation line includes at least one second sub-segment, and two ends of the second sub-segment are coupled to the corresponding first data line; and in a case that the second compensation line includes multiple second sub-segments, there is a gap between adjacent second sub-segments, and the gap is traversed by the first connecting portion.

Based on the above-mentioned technical solutions of the display substrate, a second aspect of the present disclosure provides a display device including the above-mentioned display substrate.

BRIEF DESCRIPTION OF THE DRAWINGS

The accompanying drawings are included to provide a further understanding of the present disclosure and constitute a part of this disclosure. Exemplary embodiments of the present disclosure and descriptions thereof serve to explain the present disclosure and do not constitute an undue limitation of the present disclosure. In the drawings.

DETAILED DESCRIPTION

In order to further explain the display substrate and the display device provided by the embodiments of the present disclosure, a detailed description is made in conjunction with the accompanying drawings.

Figure 1:
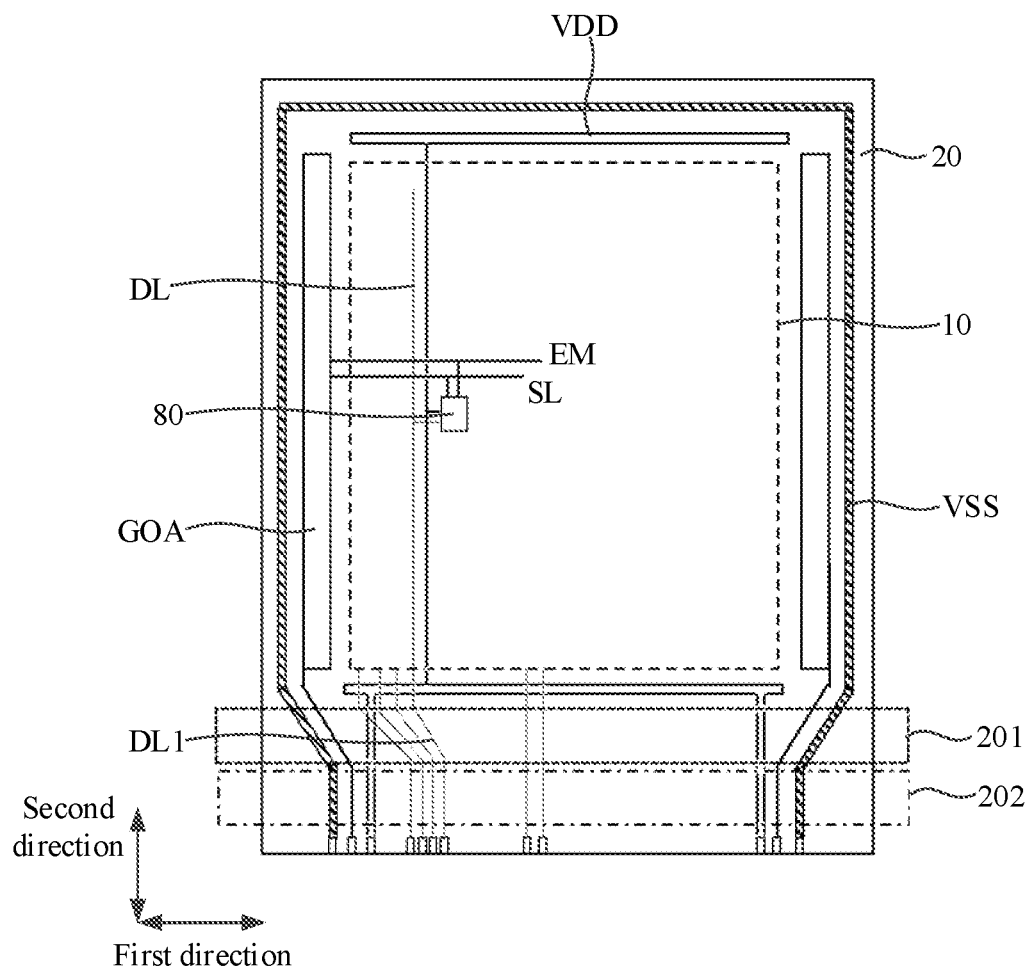
FIG. 1 is a first schematic structural diagram of a display substrate provided by embodiments of the present disclosure.
Figure 2:
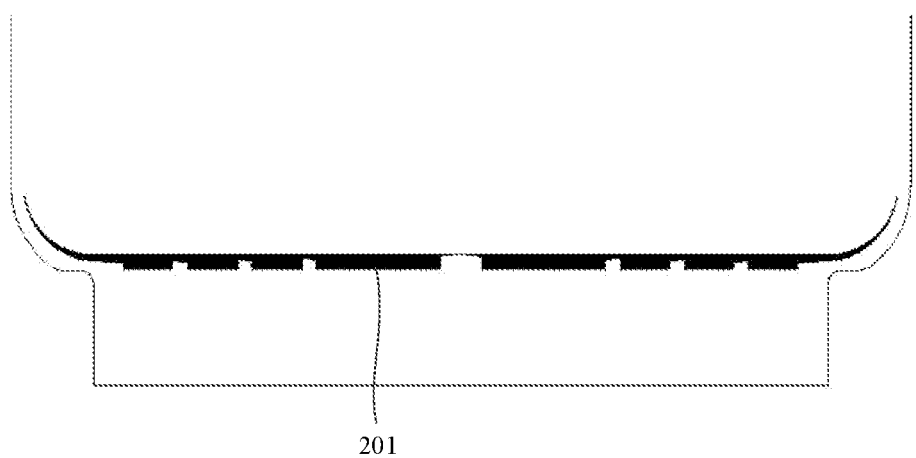
FIG. 2 is a schematic diagram of a fan-out region provided by embodiments of the present disclosure.

As shown in FIGS. 1 and 2, the present disclosure provides a display substrate, the display substrate includes a display region 10 and a peripheral region 20 surrounding the display region 10, the display region 10 is provided with multiple data lines DL, the multiple data lines DL are arranged in a first direction, at least part of each data line DL extends in a second direction, and the second direction is perpendicular to the first direction; the peripheral region 20 includes a fan-out region 201, and the multiple data lines DL are coupled to multiple data fan-out lines DL1 arranged in the fan-out region 202, and the connection with the driving chip is realized through the data fan-out lines DL1.

It should be noted that a positive power supply line VDD, a negative power supply line VSS, a bending region 202, a gate driving circuit GOA, a sub-pixel 80, a light-emission control signal line EM, and a scanning line SL are also shown in FIG. 1.

In the display substrate, a gap width (pitch) between data lines is consistent with a gap width between sub-pixels, namely, a gap width of adjacent data lines in the first direction is approximately the same as a width of a sub-pixel driving circuit included in the sub-pixel in the first direction, and therefore the multiple data lines are uniformly arranged along the first direction in the whole display region. It should be noted that, the gap width between the adjacent data lines in the first direction being approximately the same as the width of the sub-pixel driving circuit included in the sub-pixel in the first direction means that: a difference between the gap width of the adjacent data lines in the first direction and the width of the sub-pixel driving circuit included in the sub-pixel in the first direction is less than 100 microns, in an error range of a manufacturing process.

The multiple data lines are coupled to the corresponding driving chip via multiple data fan-out lines. When arranging the multiple data fan-out lines corresponding to the driving chip, multiple data fan-out lines in the middle extend along the second direction (such as, formed as vertical tracks), data fan-out lines on two sides extend along a third direction (such as, formed as oblique tracks), and the third direction is neither parallel nor perpendicular to the first direction and the second direction; in this way, when the number of data fan-out lines as provided is relatively large, the distance between the driving chip and the display region needs to be relatively large so as to ensure that there is sufficient space to distribute the data fan-out lines, and the width of a lower border of the corresponding display substrate that is used for arranging the driving chip is relatively large. It should be noted that, in the second direction, the width of the lower border that is occupied by the fan-out region 201 of the display substrate ranges approximately from 1.2 mm to 1.5 mm, inclusively.

Therefore, in the above-mentioned display substrate, in order to ensure a good layout of the data fan-out lines, the display substrate needs to have a lower border with a relatively large width, which is not conducive to the narrow-border development of the display substrate.

With reference to FIGS. 1, 2, 5, 6 and 8, embodiments of the present disclosure provide a display substrate, including:

a display region 10 and a peripheral region 20 surrounding the display region 10; where the display region 10 includes at least one group of pixel regions, the group of pixel regions includes a first pixel region 101 and two second pixel regions 102, and the first pixel region 101 is located between the two second pixel regions 102 along a first direction; the peripheral region includes a fan-out region 201, the fan-out region 201 is located on a side of the first pixel region 101 along a second direction, and the second direction intersects with the first direction. The display substrate further includes:

multiple first data lines 301, where at least part of the first data line 301 is located in the first pixel region 101, and the first data line 301 includes a part extending along the second direction;

multiple second data lines 302, where at least part of the second data line 302 is located in the second pixel region 102, and the second data line 302 includes a part extending along the second direction; and multiple connecting lines 40, where the connecting line 40 is coupled to a corresponding second data line 302, the connecting line 40 includes a portion located in the first pixel region 101, and the connecting line 40 (such as a second connecting portion 402) extends from the first pixel region 101 to the fan-out region 201.

In an example, the first direction is perpendicular to the second direction.

In an example, the display region 10 includes a group of pixel regions and a driving chip IC.

In an example, the display region 10 includes multiple groups of pixel regions arranged along the first direction, the display substrate includes multiple driving chips IC, the multiple groups of pixel regions correspond to the multiple driving chips IC on a one-to-one basis, and the driving chip IC is used for providing data signals to first data lines 301 and second data lines 302 in a corresponding group of pixel regions. In an example, when the display substrate includes a large-sized display substrate, the display region 10 includes multiple groups of pixel regions and multiple driving chips IC.

In an example, the fan-out region 201 includes multiple fan-out sub-regions, where the multiple fan-out sub-regions correspond to the multiple groups of pixel regions on a one-to-one basis, and the fan-out sub-region is located on a side of the first pixel region 101 in a corresponding group of pixel regions in the second direction.

In an example, an area of the first pixel region 101 and an area of the second pixel region 102 are substantially the same; or, an area of the first pixel region 101 is smaller than an area of the second pixel region 102; or, an area of the first pixel region 101 is larger than an area of the second pixel region 102.

In an example, the display substrate includes multiple sub-pixels 80, the multiple sub-pixels include multiple sub-pixel driving circuits distributed in an array in the whole display region 10. In an example, the sub-pixel driving circuit includes a 7T1C structure, i.e., including 7 transistors and a capacitor, which is not limited thereto. In an example, each sub-pixel 80 further includes an anode pattern, an organic light-emitting material layer, and a cathode that are sequentially stacked along a direction of leaving the base of the display substrate. In an example, the cathodes of the multiple sub-pixels are formed as an integral structure covering the display region 10. In an example, the display substrate further includes an electron injection layer, an electron transport layer, a hole transport layer, and a hole injection layer that cover the display region 10 and are between the anode pattern and the cathode.

Figure 3:
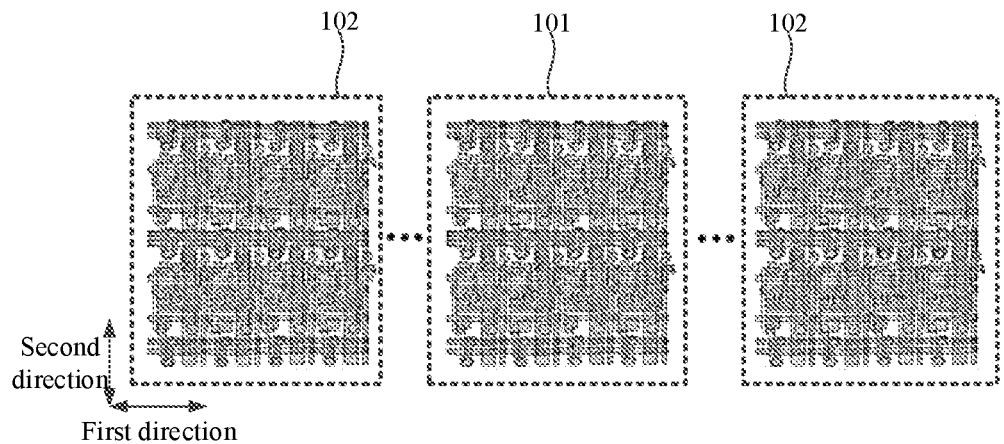
FIG. 3 is a schematic diagram of 7T1C layout provided by embodiments of the present disclosure.
Figure 4:
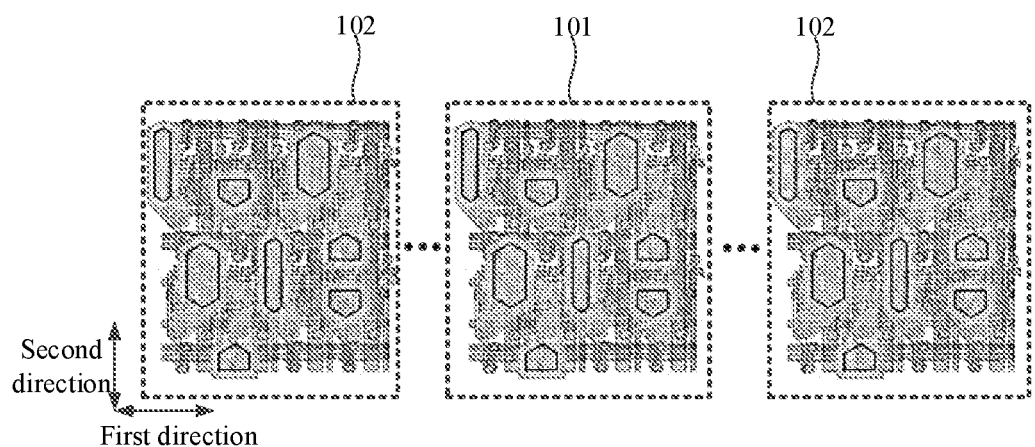
FIG. 4 is a schematic diagram of 7T1C layout and an anode pattern provided by embodiments of the present disclosure.
Figure 5:
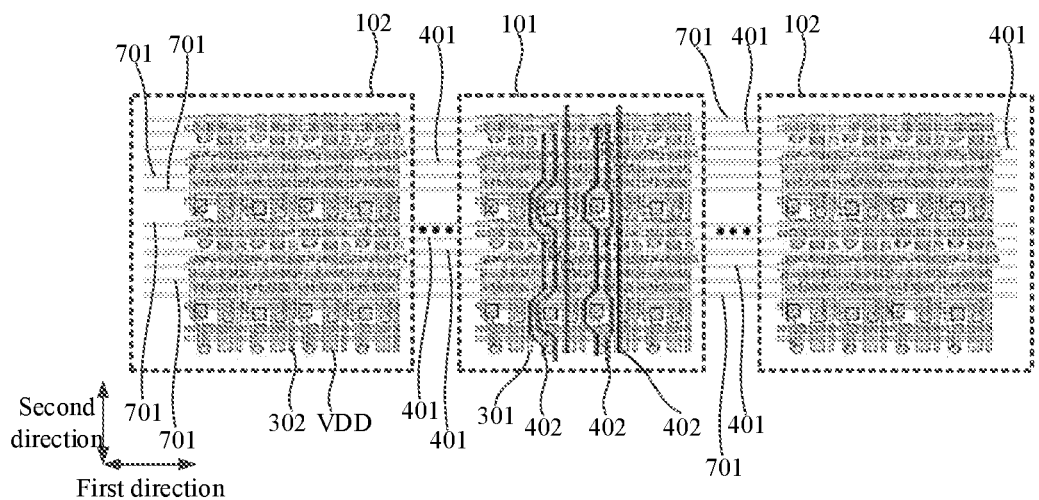
FIG. 5 is a schematic diagram of 7T1C layout and a connecting line according to embodiments of the present disclosure.

It should be noted that FIG. 3 illustrates a diagram of layout of a sub-pixel driving circuit with a 7T1C structure. FIG. 4 illustrates a schematic diagram of FIG. 3 stacked with an anode pattern. FIG. 7 illustrates a schematic diagram of FIG. 6 stacked with an anode pattern.

In an example, the multiple sub-pixel driving circuits are divided into multiple columns of sub-pixel driving circuits arranged in the first direction, and each column of sub-pixel driving circuits includes multiple sub-pixel driving circuits arranged in the second direction.

In an example, the multiple columns of sub-pixel driving circuits include multiple columns of first sub-pixel driving circuits located in the first pixel region 101 and multiple columns of second sub-pixel driving circuits located in the second pixel region 102.

In an example, the multiple first data lines 301 are in one-to-one correspondence with the multiple columns of first sub-pixel driving circuits, each first data line 301 includes multiple first sub-data lines arranged along the second direction, the multiple first sub-data lines are in one-to-one correspondence with multiple sub-pixel driving circuits in a corresponding column of first sub-pixel driving circuits, and the first sub-data line is coupled to the corresponding sub-pixel driving circuit for providing a data signal to the corresponding sub-pixel driving circuit. In an example, the multiple first sub-data lines are sequentially coupled to form the first data line 301 which is an integral structure. In an example, each first sub-data line includes a portion extending in the second direction.

In an example, the multiple second data lines 302 are in one-to-one correspondence with the multiple columns of second sub-pixel driving circuits, each second data line 302 includes multiple second sub-data lines arranged along the second direction, the multiple second sub-data lines are in one-to-one correspondence with multiple sub-pixel driving circuits in a corresponding column of second sub-pixel driving circuits, and the second sub-data line is coupled to the corresponding sub-pixel driving circuit for providing a data signal to the corresponding sub-pixel driving circuit. In an example, the multiple second sub-data lines are sequentially coupled to form the second data line 302 which is an integral structure. In an example, each second sub-data line includes a portion extending in the second direction.

In an example, the display substrate includes an active layer, a first gate insulating layer, a first gate metal layer, a second gate insulating layer, a second gate metal layer, an interlayer insulating layer, and a first source and drain metal layer, which are sequentially stacked in a direction away from the base. In an example, the first data line 301 and the second data line 302 are each made of the first source and drain metal layer.

In an example, the multiple connecting lines 40 are in one-to-one correspondence with the multiple second data lines 302, the connecting line 40 is coupled with the corresponding second data line 302, the connecting line 40 include a portion located in the first pixel region 101 and a portion located in the second pixel region 102, and the portion of the connecting line 40 which is located in the first pixel region 101 extends from the first pixel region 101 to the corresponding fan-out sub-region 201.

In an example, the connecting line 40 includes a portion extending in the first direction and a portion extending in the second direction.

In an example, the connecting line 40 extends from the first pixel region 101 to the fan-out region 201 and is coupled to a corresponding driving chip IC, and the connecting line 40 transmits a driving signal provided by the driving chip IC to a corresponding second data line 302.

According to the above-mentioned specific structure of the display substrate, it can be seen that in the display substrate provided by the embodiments of the present disclosure, the second data line 302 is coupled to the corresponding connecting line 40, and the connecting line 40 extends from the second pixel region 102 to the first pixel region 101 and extends from the first pixel region 101 to the fan-out region 201, so as to realize coupling with the corresponding driving chip IC. Since the gap width between the first data line 301 and the connecting line 40 in the display substrate is small, both the first data line 301 and the connecting line 40 can extend from the first pixel region 101 to the fan-out region 201, so that both the first data line 301 and the connecting line 40 can exit at a small angle (an included angle with the second direction), reducing the extension range of the first data line 301 and the connecting line 40 in the fan-out region 201 along the first direction, thereby reducing the width of the fan-out region 201 in the second direction, and effectively reducing the width of the lower border of the display substrate.

As shown in FIGS. 6, 8-10, 13 and 14, in some embodiments, the connecting line 40 includes a first connecting portion 401 and a second connecting portion 402 coupled with each other;

the first connecting portion 401 includes a portion extending along the first direction, and the first connecting portion 401 is coupled with the corresponding second data line 302; and the second connecting portion 402 includes a portion extending in the second direction, at least part of the second connecting portion 402 is located in the first pixel region 101, and the second connecting portion 402 extends from the first pixel region 101 to the fan-out region 201.

In an example, the first connecting portion 401 includes only a portion extending in the first direction. In an example, the first connecting portion 401 extends through the display region 10 in the first direction. In an example, the first connecting portion 401 includes a portion extending in the first direction and a portion extending in the second direction.

In an example, the orthographic projection of the first connecting portion 401 onto the base of the display substrate and the orthographic projection of the corresponding second data line 302 onto the base have an overlap region, and the first connecting portion 401 is coupled to the corresponding second data line 302 through a via hole 50, the orthographic projection of the via hole 50 onto the base is located in the overlap region.

In an example, the second connecting portion 402 includes a portion extending in the second direction, at least part of the second connecting portion 402 is located in the first pixel region 101, and the second connecting portion 402 extends through the display region 10 in the second direction.

In an example, the second connecting portion 402 may not extend through the display region 10 in the second direction, the second connecting portion 402 only extends to the fan-out region 201 from the location where it is coupled to the first connecting portion 401.

With the above-mentioned arrangement where the connecting line 40 includes the first connecting portion 401 and the second connecting portion 402 coupled to each other, it is ensured that the second data line 302 is led to the fan-out region 201, and the arrangement difficulty of the connecting line 40 is reduced effectively.

Figure 6:
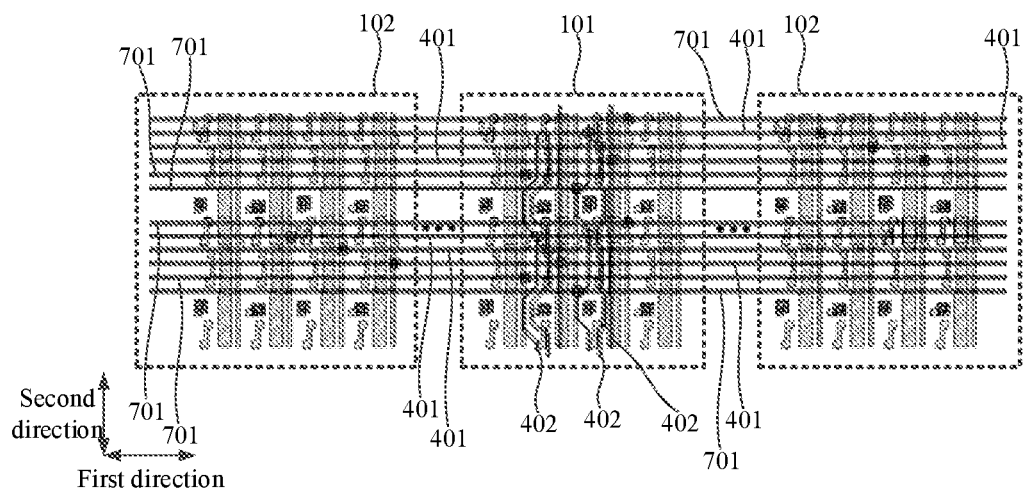
FIG. 6 is a schematic diagram of a data line and a connecting line provided by embodiments of the present disclosure.
Figure 7:
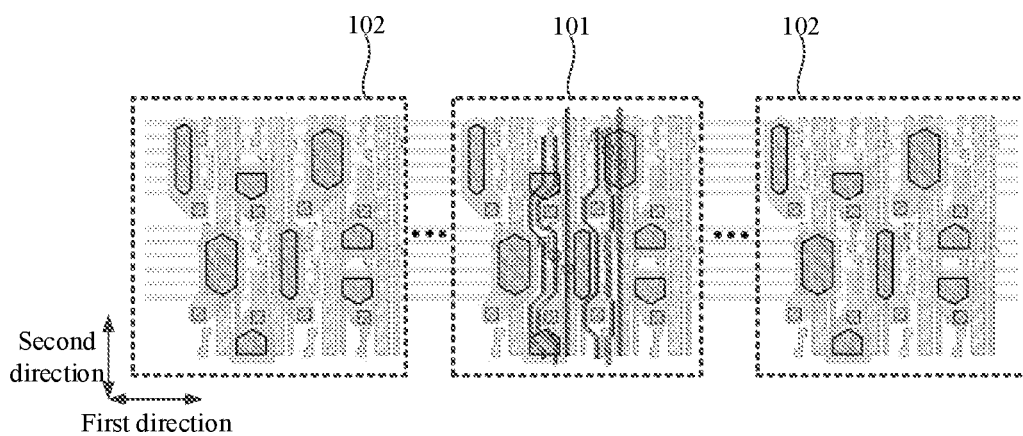
FIG. 7 is a schematic diagram of a connecting line and an anode pattern provided by embodiments of the present disclosure.

As shown in FIG. 6, in some embodiments, the multiple first connecting portions 401 included in the multiple connecting lines 40 are arranged along the second direction, and two adjacent first connecting portions of the multiple first connecting portions 401 have substantially the same length; and/or, the multiple second connecting portions 402 included in the multiple connecting lines 40 are aligned along the first direction, and two adjacent second connecting portions of the multiple second connecting portions 402 have substantially the same length.

In an example, the length of the first connecting portion 401 refers to the path length that the first connecting portion 401 extends, and the length of the second connecting portion 402 refers to the path length that the second connecting portion 402 extends.

In an example, any two of the multiple first connecting portions 401 have substantially the same length; and/or, any two of the multiple second connecting portions 402 have substantially the same length.

In an example, the orthographic projections onto the base of two adjacent first connecting portions of the multiple first connecting portions 401 have substantially the same length; and/or, the orthographic projections onto the base of two adjacent second connecting portions of the multiple second connecting portions 402 have substantially the same length.

In an example, being substantially the same as mentioned above includes: the difference in length caused by errors in manufacturing process is within 100 microns.

In an example, the multiple first connecting portions 401 included in the multiple connecting lines 40 are arranged in the same layer and made of the same material, and the multiple first connecting portions 401 included in the multiple connecting lines 40 are arranged at intervals along the second direction and insulated from each other.

In an example, the multiple second connecting portions 402 included in the multiple connecting lines 40 are arranged in the same layer and made of the same material, and the multiple second connecting portions 402 included in the multiple connecting lines 40 are arranged at intervals along the first direction and insulated from each other.

In an example, the first connecting portion 401 spans most of the display region 10 in the first direction to cause the voltage drop of the data signal transmitted by the coupled second data line 302 to be uniform.

With the above-mentioned arrangement where the lengths of the multiple first connecting portions 401 are substantially the same and/or the lengths of the multiple second connecting portions 402 are substantially the same, the connecting lines 40 have good load uniformity, which is beneficial to improve voltage drop uniformity of data lines in the display substrate.

As shown in FIG. 6, in some embodiments, the first data line 301 and the second data line 302 are arranged in the same layer and made of the same material; the first connecting portion 401 is located on a side of the second data line 302 facing away from the base of the display substrate; the second connecting portion 402 is located on a side of the first connecting portion 401 facing away from the base.

In an example, the first data line 301 and the second data line 302 are arranged in the same layer and made of the same material, and the first source and drain metal layer includes the first data line 301 and the second data line 302.

In an example, the display substrate further includes a first planarization layer, a second source and drain metal layer, a second planarization layer, a third source and drain metal layer and a third planarization layer, which are sequentially stacked in a direction away from the base, on a side of the first source and drain metal layer facing away from the base, and the anode pattern is located on a side of the third planarization layer facing away from the base.

In an example, the display substrate may further include a passivation layer between the first source and drain metal layer and the first planarization layer.

In an example, the second source and drain metal layer includes the first connecting portion 401, and the third source and drain metal layer includes the second connecting portion 402.

In an example, the second source and drain metal layer further includes a second conductive connection portion, the third source and drain metal layer further includes a third conductive connection portion, and the anode pattern is coupled to a corresponding sub-pixel driving circuit via the third conductive connection portion and the second conductive connection portion, and receives a driving signal provided by the corresponding sub-pixel driving circuit.

The above-mentioned arrangement can effectively simplify the manufacturing process of the display substrate and reduce the manufacturing cost of the display substrate.

In more detail, in the display substrate provided by the above-mentioned embodiments, it is not needed to adjust the interval width between pixels, and it is only needed to couple the second data line 302 in the second pixel region 102 to the first pixel region 101 via a corresponding first connecting portion 401 (namely, an SD2 line), and then couple it to the fan-out region 201 located at the bottom of the display region 10 via a corresponding second connecting portion 402 (namely, an SD3 line). Originally, one data line is arranged within a pixel pitch. In the present disclosure, after connecting and optimizing through the connecting line 40, three SD3 lines (corresponding to three second data lines 302) can be added within one pixel pitch, namely, one first data line 301 and three SD3 lines can be arranged within one pixel pitch, which greatly reduces the data line pitch and effectively reduces the width of the lower border of the display substrate.

Figure 8:
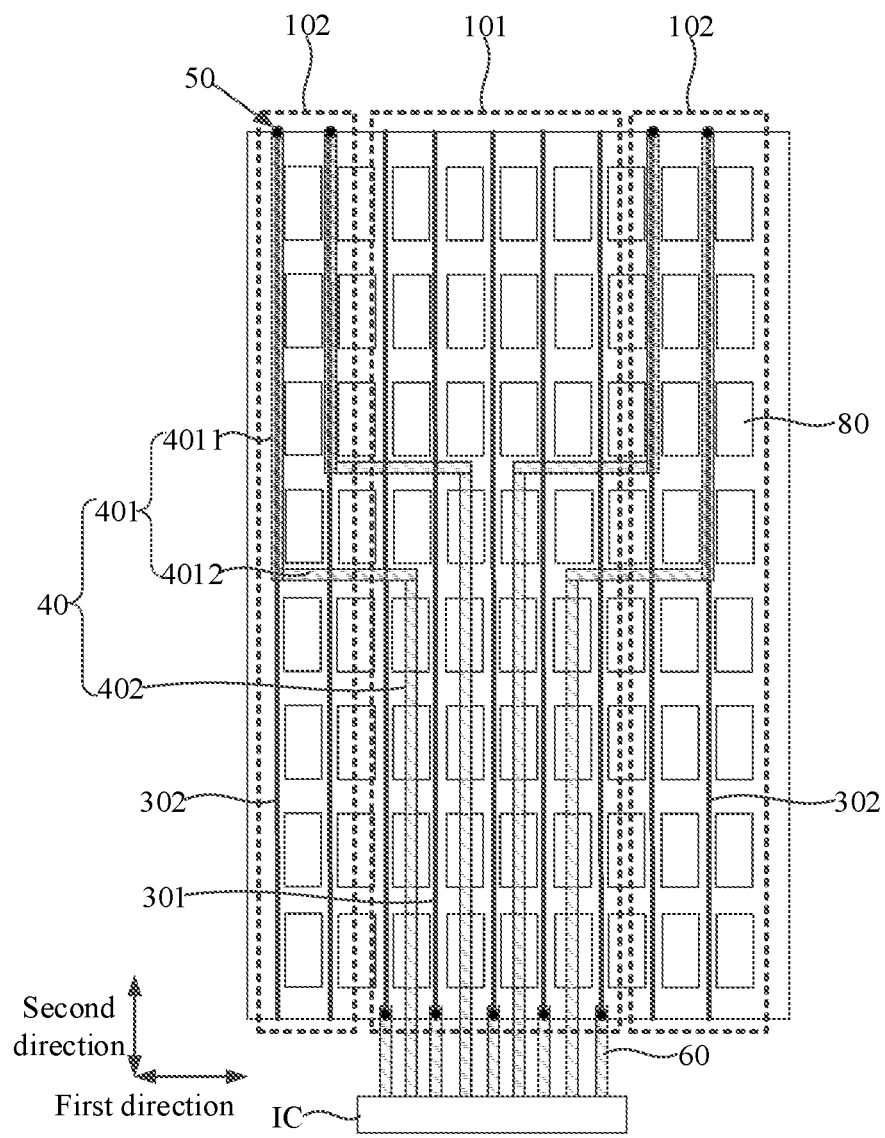
FIG. 8 is a second schematic structural diagram of a display substrate provided by embodiments of the present disclosure.
Figure 9:
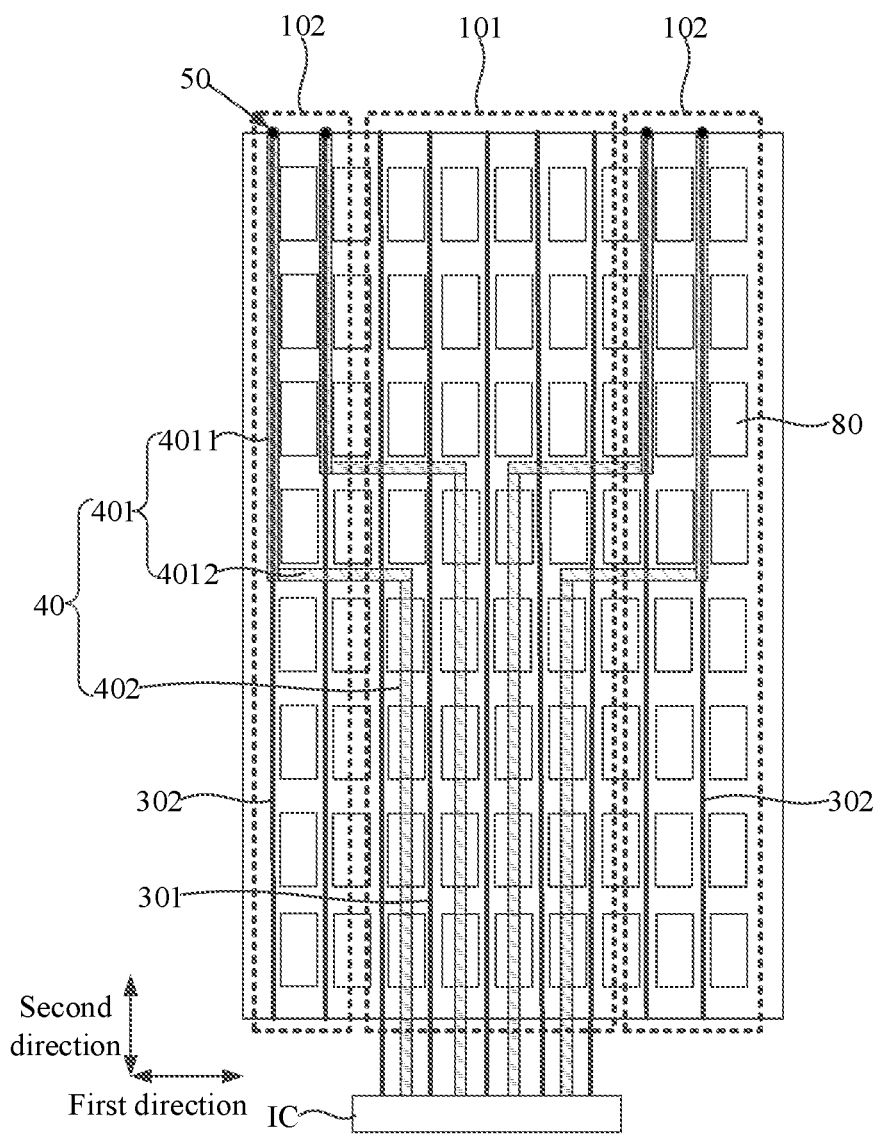
FIG. 9 is a third schematic structural diagram of a display substrate provided by embodiments of the present disclosure.

As shown in FIGS. 8 and 9, in some embodiments, the first connecting portion 401 includes a first sub-portion 4011 and a second sub-portion 4012 coupled together;
the first sub-portion 4011 includes a portion extending along the second direction, and the first sub-portion 4011 is coupled with the corresponding second data line 302; and
the second sub-portion 4012 includes a portion extending in the first direction, and the second sub-portion 4012 is coupled to the second connecting portion 402.

In an example, the first sub-portion 4011 and the second sub-portion 4012 are formed as an integral structure. In an example, the first connecting portion 401 and the second connecting portion 402 are formed as an integral structure.

In an example, the first sub-portion 4011 traverses a portion of the display region 10 in the second direction.

In an example, in the display substrate, each connecting line 40 has the same length, and the length refers to the path length along which the connecting line 40 extends.

In an example, the orthographic projection of the first sub-portion 4011 onto the base of the display substrate at least partially overlaps the orthographic projection of the corresponding second data line 302 onto the base.

In an example, in the fan-out region 201, the orthographic projection of the second sub-portion 4012 onto the base does not overlap the orthographic projection of the first data line 301 onto the base.

In an example, in the first pixel region 101, the orthographic projection of the second sub-portion 4012 onto the base at least partially overlaps the orthographic projection of the first data line 301 onto the base, or, the orthographic projection of the second sub-portion 4012 onto the base does not overlap the orthographic projection of the first data line 301 onto the base.

With the above-mentioned arrangement where the first connecting portion 401 includes the first sub-portion 4011 and the second sub-portion 4012, it is ensured that the second data line 302 is led to the fan-out region 201, and the arrangement difficulty of the connecting line 40 is effectively reduced.

Figure 10:
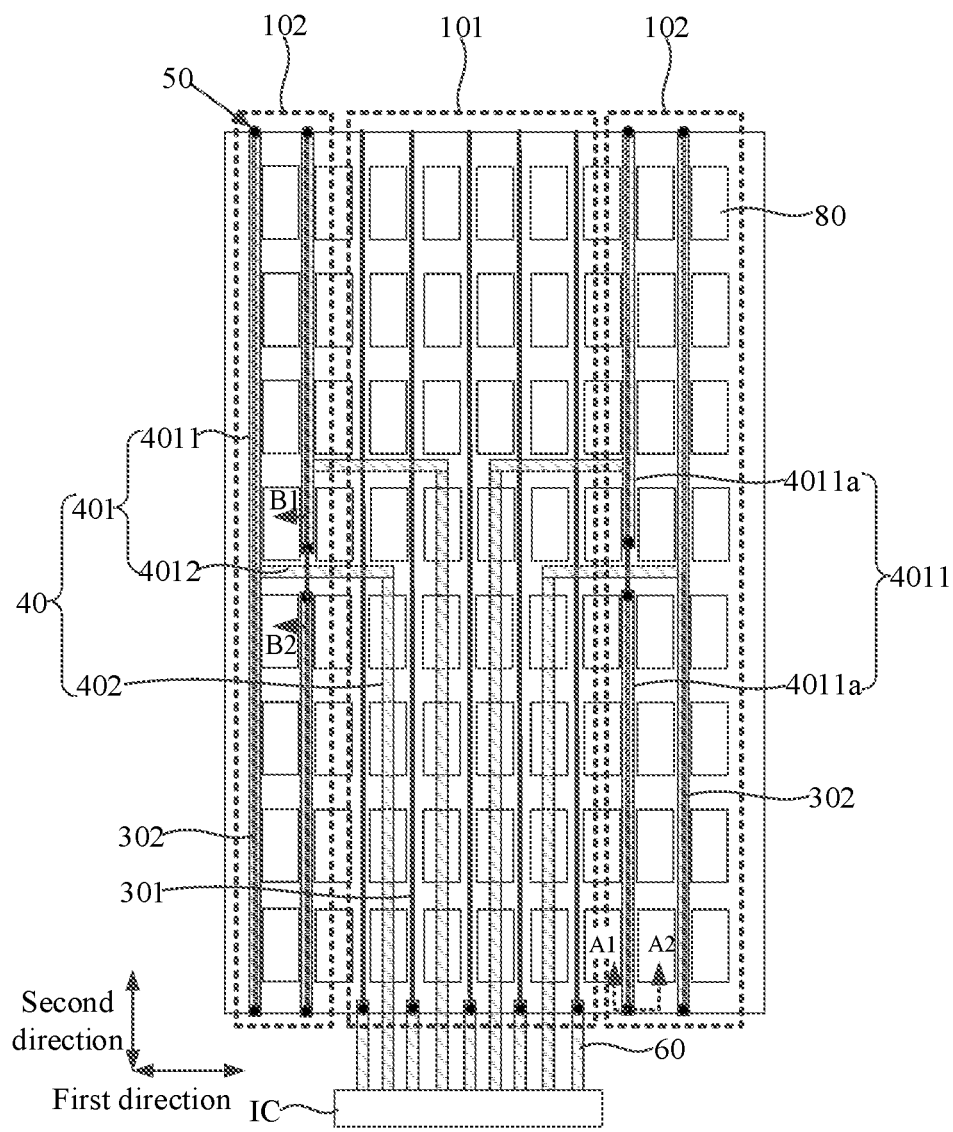
FIG. 10 is a fourth schematic structural diagram of a display substrate provided by embodiments of the present disclosure.
Figure 12:
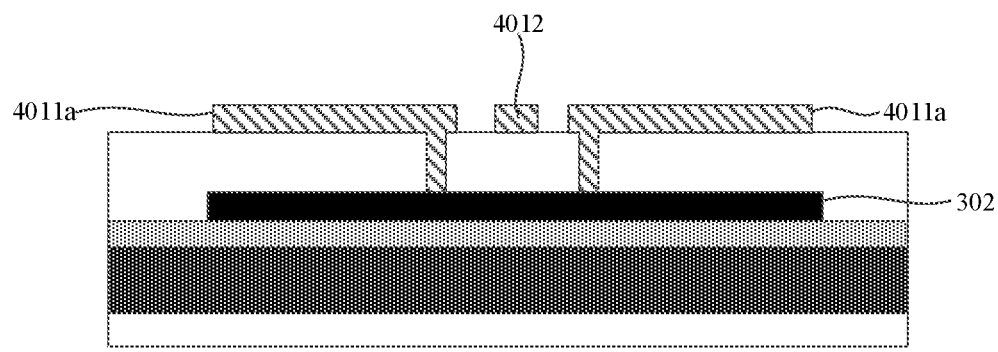
FIG. 12 is a schematic cross-sectional diagram taken along the direction B1-B2 in FIG. 10.

As shown in FIGS. 10 and 12, in some embodiments, the first sub-portion 4011 extends through the display region 10 in the second direction; the first sub-portion 4011 includes at least one first sub-segment 4011a, and two ends of the first sub-segment 4011a are coupled to the corresponding second data line 302; the second sub-portion 4012 is coupled to one of the first sub-segments 4011a;
in a case that the first sub-portion 4011 includes multiple first sub-segments 4011a, there is a gap between adjacent first sub-segments 4011a; the gap is traversed by a second sub-portion 4012 included in another first connecting portion 401.

In an example, the first sub-portion 4011 extends through the display region 10 in the second direction, the length of the first sub-portion 4011 is substantially the same as the length of the second data line 302.

In an example, in the same group of pixel regions, the connecting line 40 corresponding to the second data line 302 that is furthest from the first pixel region 101 in the first direction includes one first sub-segment 4011a, and the remaining connecting lines 40 each include at least two first sub-segments 4011a.

In an example, the first sub-segment 4011a is arranged in a layer different from the corresponding second data line 302, and the first sub-segment 4011a is coupled with the corresponding second data line 302 through at least one via hole.

In an example, in the same first connecting portion 401, the second sub-portion 4012 is coupled to at least one first sub-segment 4011a.

In an example, each first sub-segment 4011a includes a portion extending along the second direction, multiple first sub-segments 4011a belonging to the same first sub-portion 4011 are arranged at intervals in sequence along the second direction, there is a gap between adjacent first sub-segments 4011a, and the gap is traversed by a second sub-portion 4012 included in another first connecting portion 401, where the another first connecting portion 401 refers to a first connecting portion 401 other than the first connecting portion 401 to which this first sub-segment 4011a belongs.

Figure 11:
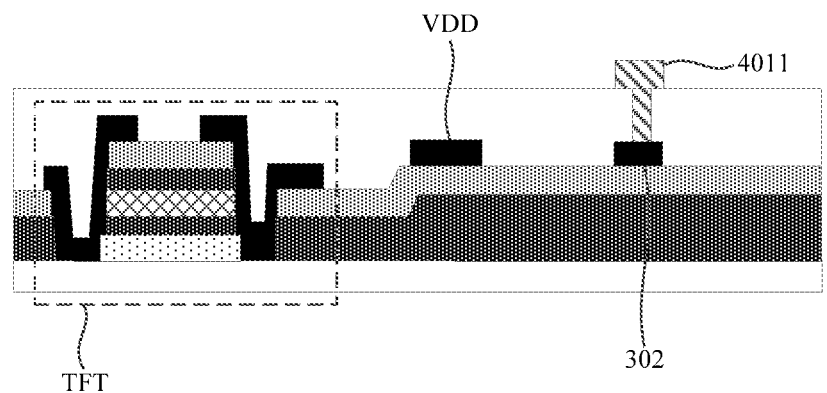
FIG. 11 is a schematic cross-sectional diagram taken along the direction A1-A2 in FIG. 10.

It should be noted that as shown in FIG. 11, a first sub-segment 4011a is shown to be coupled to a corresponding second data line 302 via a via hole, and a thin film transistor structure TFT and a positive power supply line VDD are also shown in FIG. 11. As shown in FIG. 12, it is illustrated that adjacent first sub-segments 4011a are punched and coupled with the corresponding second data lines 302, so that different first connecting portions 401 can bypass each other via jumper wires to avoid overlapping each other.

With the above-mentioned arrangement where the first sub-portion 4011 traverses the display region 10 in the second direction, it is enabled that the second data line 302 forms a manner similar to double data line transmission, thereby further reducing a voltage drop of the second data line 302 in transmitting a data signal.

With the above-mentioned arrangement where two ends of each first sub-segment 4011a are coupled with a corresponding second data line 302 and the second sub-portion 4012 is coupled with one of the first sub-segments 4011a, the data signal transmitted by the second sub-portion 4012 can be written into the corresponding second data line 302 from the two ends of the first sub-segment 4011a simultaneously, realizing the bidirectional simultaneous input of the data signal, effectively reducing the resistance-capacitance load of the second data line 302, reducing the voltage drop of the data signal transmitted by the second data line 302, and improving the display uniformity of the display substrate.

In the above-mentioned arrangement, in the case where the first sub-portion 4011 includes multiple first sub-segments 4011a, there is a gap between adjacent first sub-segments 4011a, and the gap is traversed by the second sub-portion 4012 included in another first connecting portion 401, so that the multiple connecting lines 40 can connect their respective second data lines 302 to the fan-out region 201 to realize coupling with respective driving chip ICs when mutual insulation of the multiple connecting lines 40 is ensured.

As shown in FIG. 10, in some embodiments, the first connecting portion 401 and the second connecting portion 402 are arranged in the same layer and made of the same material, and the first connecting portion 401 is arranged in a different layer from the second data line 302.

In an example, the first source and drain metal layer includes the second data line 302, and the second source and drain metal layer includes the first connecting portion 401 and the second connecting portion 402. This arrangement is advantageous in simplifying the manufacturing process of the display substrate and reducing the manufacturing cost of the display substrate.

Figure 13:
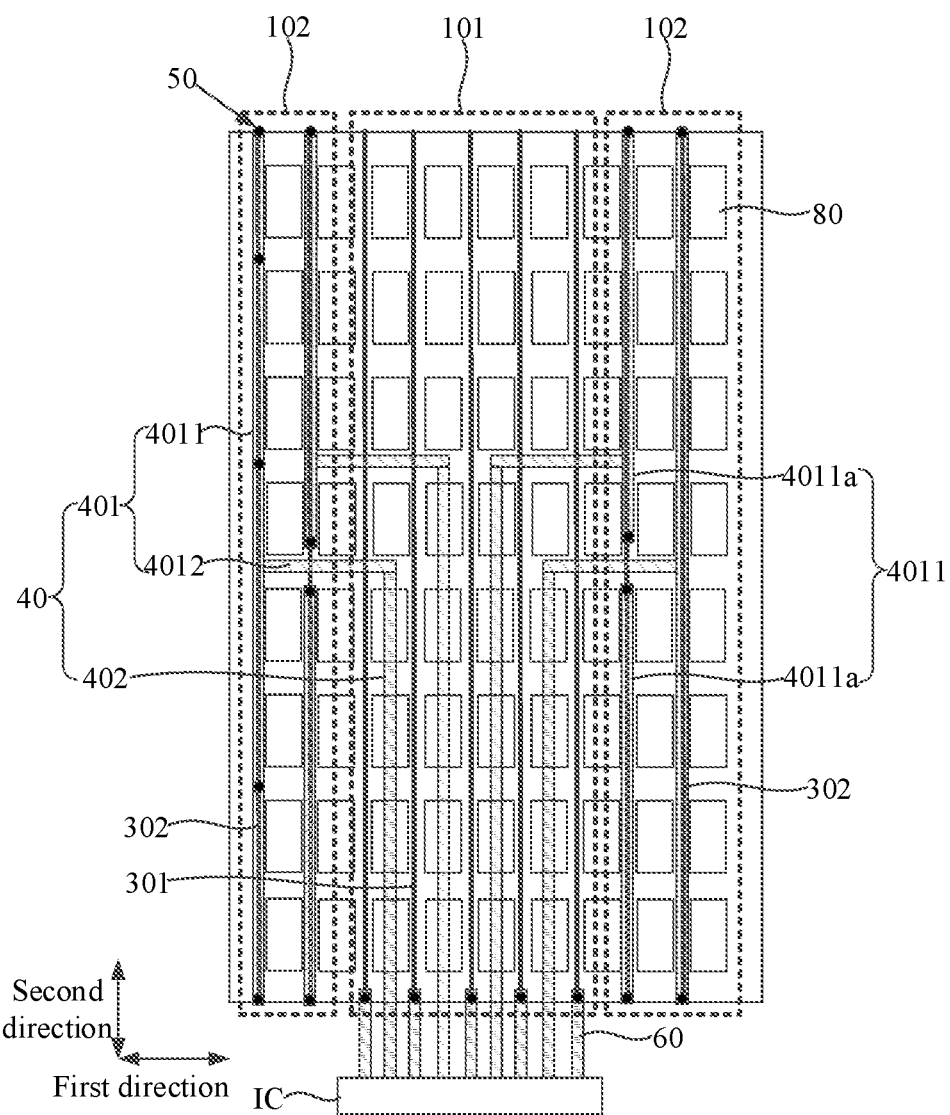
FIG. 13 is a fifth schematic structural diagram of a display substrate provided by embodiments of the present disclosure.

As shown in FIGS. 8 and 13, in some embodiments, the first sub-portion 4011 is coupled to the corresponding second data line 302 through at least one via hole 50; in the case where the first sub-portion 4011 and the corresponding second data line 302 are coupled through multiple via holes, the multiple via holes are arranged in the second direction.

In an example, the first sub-portion 4011 is coupled to the corresponding second data line 302 via one via hole, where the via hole is located at an upper border of the display substrate, and the upper border is opposite to the lower border where the fan-out region 201 is located along the second direction.

In an example, the first sub-portion 4011 and the corresponding second data line 302 are coupled via two via holes, where one via hole is located at the upper border of the display substrate and the other via hole is located at the lower border of the display substrate.

In above-mentioned arrangement, the first sub-portion 4011 is coupled to a corresponding second data line 302 via multiple via holes, and the multiple via holes are arranged along the second direction; in this way, the resistance-capacitance load of the second data line 302 is effectively reduced, and the voltage drop of a data signal transmitted by the second data line 302 is further reduced.

As shown in FIG. 9, in some embodiments, the first data line 301 is arranged to extend from the first pixel region 101 to the fan-out region 201.

In an example, the first data line 301 extends from the first pixel region 101 to the fan-out region 201 and is coupled to a corresponding driving chip IC.

With the above-mentioned arrangement, the first data line 301 can be coupled to a corresponding driving chip IC without a jumper wire, and receive a driving signal provided by the driving chip IC, thereby better ensuring the reliability and operation stability of the first data line 301.

Furthermore, since a jumper wire is not required, punching and the jumper wire process of the gate metal layers are not required, the manufacturing process of the display substrate is better simplified, the manufacturing time is reduced and the manufacturing cost of the display substrate is reduced.

As shown in FIGS. 8, 10, 13, 14, 15, and 16, in some embodiments, the display substrate further includes:

multiple first extension lines 60, where the first extension line 60 is coupled to a corresponding first data line 301, the first extension line 60 extends from the first pixel region 101 to the fan-out region 201, and the first extension line 60 is arranged in the same layer and made of the same material as the second connecting portion 402.

In an example, at least part of the first extension line 60 extends in the second direction, the first extension line 60 extends from the first pixel region 101 to the fan-out region 201, a first end of the first extension line 60 is coupled to a corresponding first data line 301, a second end of the first extension line 60 is coupled to a corresponding driving chip IC, and the first extension line 60 transmits a driving signal provided by the driving chip IC to the corresponding first data line 301.

In an example, the second source and drain metal layer includes the first extension 60 and the second connecting portion.

In an example, the third source and drain metal layer includes the first extension 60 and the second connecting portion.

With the above-mentioned arrangement where the first extension line 60 and the second connecting portion 402 are arranged in the same layer and made of the same material, it is enabled that the portion of the first extension line 60 which is located in the bending region 202 has a better bending reliability.

It should be noted that, in the display substrate provided by the above-mentioned embodiments, neither the first data line 301 nor the second data line 302 needs to pass through the fan-out region 201 via a jumper wire of the first gate metal layer or the second gate metal layer, and both the first data line 301 and the second data line 302 are connected to the driving chip IC via the source and drain metal layers, in this way, punching and jumper wire process of the gate metal layers are not required, the manufacturing time of the display substrate is reduced, and the reliability of the product is improved.

In some embodiments, the display substrate further includes:

multiple compensation lines (such as a first compensation line 701 and a second compensation line 702), where the compensation line includes a portion located in the first pixel region 101, and the compensation line is coupled to a corresponding first data line 301.

In an example, the compensation line is arranged in a layer different from the first data line 301, an orthographic projection of the compensation line onto the base at least partially overlaps an orthographic projection of the corresponding first data line 301 onto the base, and the compensation line is coupled to the first data line 301 through at least one via hole. In an example, in the case where the compensation line is coupled to the first data line 301 through multiple via holes, the multiple via hole are arranged in the second direction. In an example, the compensation line is coupled to the first data line 301 through two via holes, one of which is near an upper border of the display substrate and the other of which is near a lower border of the display substrate.

In an example, the second source and drain metal layer includes the compensation line.

With the above-mentioned arrangement where the compensation line is coupled to the corresponding first data line 301, the voltage drop of the signal transmitted by the first data line 301 is further reduced.

Furthermore, the compensation line is arranged to be coupled to the corresponding first data line 301, so that the first data line 301 and the second data line 302 can be in the same environment. As a result, the parasitic capacitances formed by the first data line 301 and the second data line 302 are substantially the same, and the resistance-capacitance loads corresponding to the first data line 301 and the second data line 302 are substantially the same, thereby further improving the display uniformity of the display substrate. It should be noted that, the parasitic capacitances being substantially the same includes that: the ratio between the parasitic capacitance formed by the first data line 301 and the parasitic capacitance formed by the second data line 302 is between 0.9 and 1.1, inclusively. The resistance-capacitance loads being substantially the same includes that: the ratio between the resistance-capacitance load corresponding to the first data line 301 and the resistance-capacitance load corresponding to the second data line 302 is between 0.9 and 1.1, inclusively.

In some embodiments, the length of the compensation line is approximately the same as the length of its adjacent first connecting portion 401.

It should be noted that the length of the compensation line and the length of the first connecting portion 401 each refer to a path length.

In an example, the length of the orthographic projection of the compensation line onto the base is approximately the same as the length of the orthographic projection of its adjacent first connecting portion 401 onto the base.

With the above-mentioned arrangement where the length of the compensation line is substantially the same as the length of its adjacent first connecting portion 401, it is enabled that the first data line 301 and the second data line 302 are in a substantially same environment, and it is enabled that the loads corresponding to the first data line 301 and the second data line 302 are substantially the same, thereby further improving the display uniformity of the display substrate.

It is noted that the width of the compensation line in the display substrate provided by the present disclosure is not limited, and a person skilled in the art may adjust the length of the compensation line according to the arrangement of the width of the compensation line to cause the loads of the compensation lines to be approximately the same.

As shown in FIG. 6, in some embodiments, the multiple compensation lines include multiple first compensation lines 701, the first compensation line 701 includes a portion extending in the first direction, and the first compensation lines 701 are spaced apart from the first connecting portions 401 in the second direction.

In an example, the length of the first compensation line 701 is approximately the same as the length of the first connecting portion 401.

In an example, the length of the first compensation line 701 is approximately the same as the length of its adjacent first connecting portion 401.

In an example, the length of the orthographic projection of the first compensation line 701 onto the base is approximately the same as the length of the orthographic projection of its adjacent first connecting portion 401 onto the base.

In an example, the length of the first compensation line is approximately the same as the length of the connecting line 40.

In an example, the length of the orthographic projection of the first compensation line onto the base is approximately the same as the length of the orthographic projection of the connecting line 40 onto the base.

In an example, being approximately the same includes that: the difference in length caused by errors in manufacturing process is within 100 microns.

In an example, the first compensation lines 701 and the first connecting portions 401 are alternately arranged and are spaced apart, in the second direction.

In an example, the multiple first compensation lines 701 are divided into multiple sets of first compensation lines 701, each set of first compensation lines 701 includes at least one first compensation line 701; the multiple first connecting portions 401 in the multiple connecting lines 40 are divided into multiple groups of first connecting portions 401, and each group of first connecting portions 401 includes at least one first connecting portion 401; the various sets of first compensation lines 701 and the various groups of first connecting portions 401 are alternately arranged at intervals.

The above-mentioned arrangement enables the resistance-capacitance loads corresponding to the first data line 301 and the second data line 302 to be substantially the same, thereby further improving the display uniformity of the display substrate.

In some embodiments, the compensation line is disposed in the same layer and made of the same material as the first connecting portion 401.

In an example, the second source and drain metal layer includes the compensation line and the first connecting portion 401.

The above-mentioned arrangement enables the compensation line and the first connecting portion 401 to be formed simultaneously in the same patterning process, which effectively simplifies the manufacturing process flow of the display substrate and reduces the manufacturing cost of the display substrate.

Figure 14:
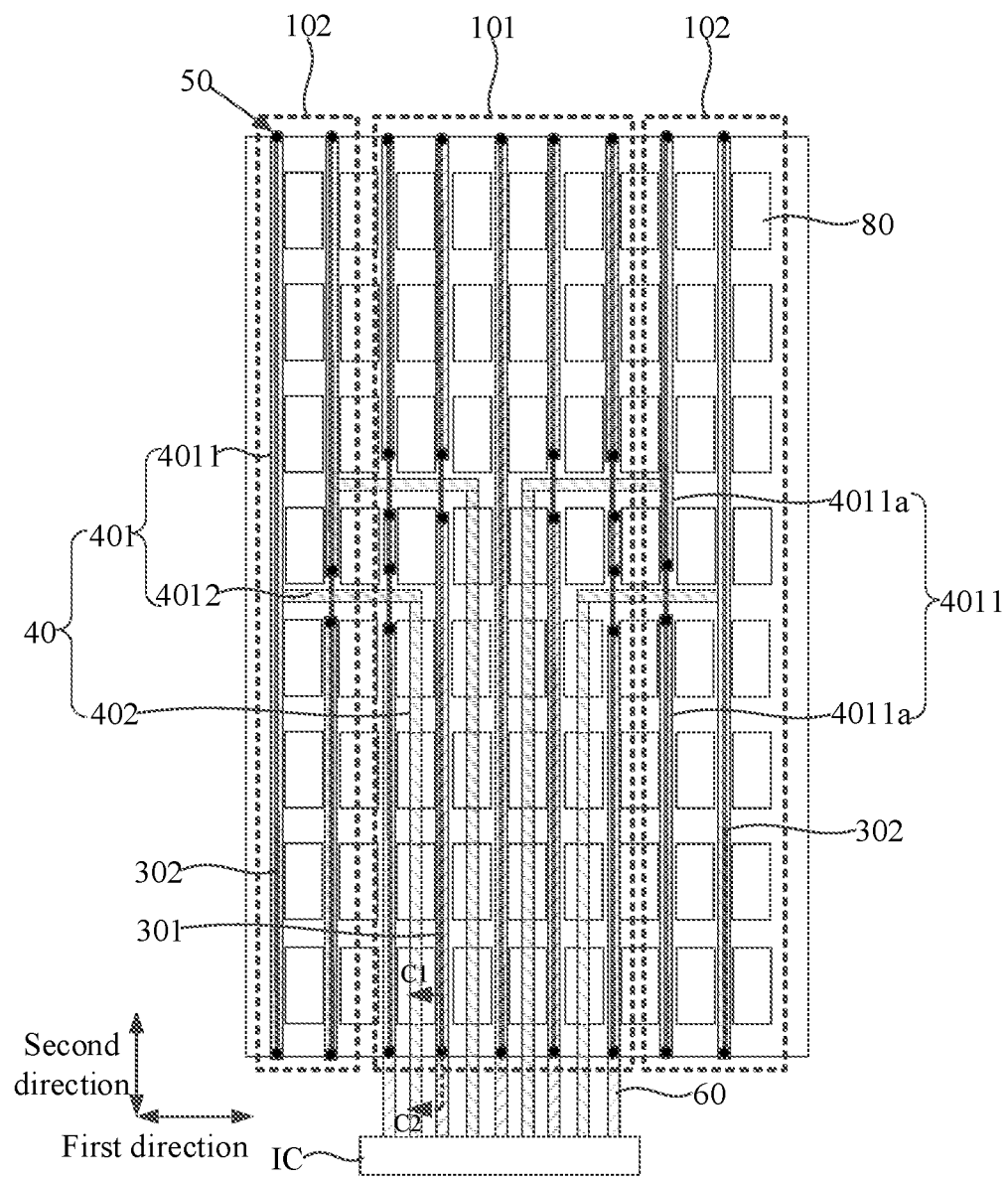
FIG. 14 is a sixth schematic structural diagram of a display substrate provided by embodiments of the present disclosure.
Figure 15:
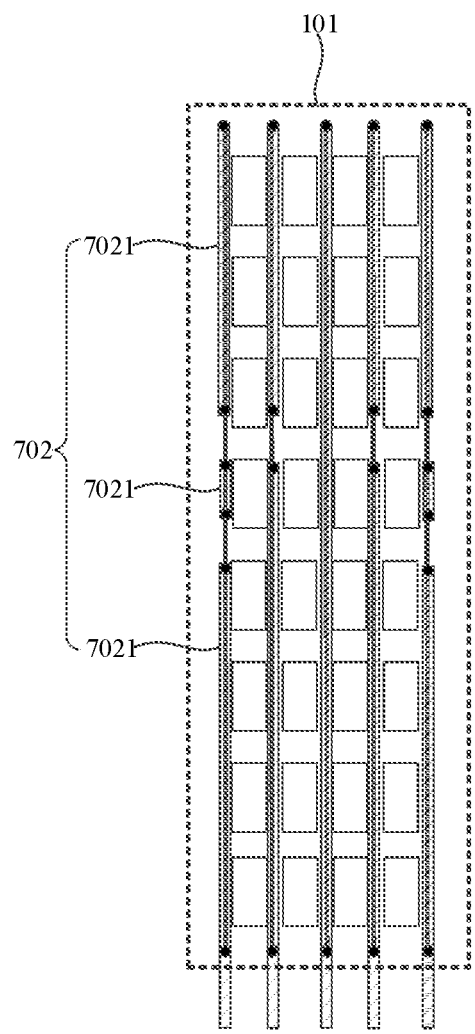
FIG. 15 is a schematic diagram of a first data line and a second compensation line in FIG. 14.
Figure 16:
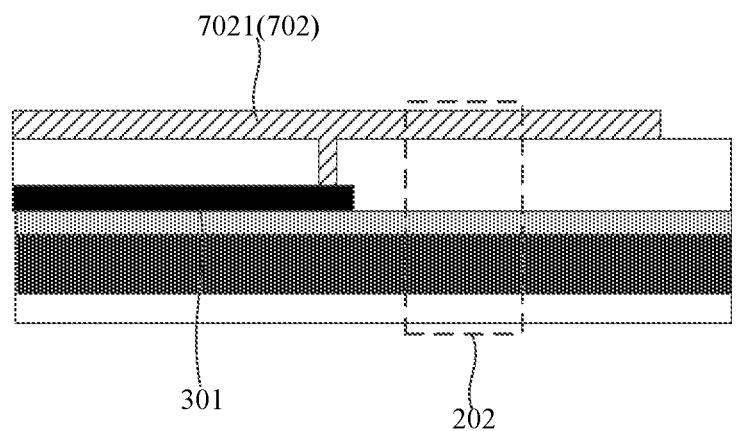
FIG. 16 is a schematic cross-sectional diagram taken along the direction C1-C2 in FIG. 14.

As shown in FIGS. 14 to 16, in some embodiments, the multiple compensation lines includes multiple second compensation lines 702, where the second compensation line extends through the display region 10 in the second direction; the second compensation line 702 includes at least one second sub-segment 7021, and two ends of the second sub-segment 7021 are coupled to a corresponding first data line 301; and in the case where the second compensation line 702 includes multiple second sub-segments 7021, there is a gap between adjacent second sub-segments 7021; the gap is traversed by the first connecting portion 401.

In an example, the second compensation line 702 extends through the display region 10 in the second direction, the length of the second compensation line 702 is substantially the same as the length of the first data line 301.

In an example, the length of the orthographic projection of the second compensation line 702 onto the base is approximately the same as the length of the orthographic projection of the first data line 301 onto the base. In an example, being approximately the same includes that the difference in length caused by errors in manufacturing process is within 100 microns.

In an example, each of the second compensation lines 702 includes at least two second sub-segments 7021.

In an example, the second compensation line 702 is arranged in a different layer from the corresponding first data line 301, and the second compensation line 702 is coupled to the corresponding first data line 301 through at least one via hole. In an example, the second compensation line 702 is coupled to the corresponding first data line 301 through multiple via holes, and the multiple via holes are arranged in the second direction.

In an example, each second sub-segment 7021 includes a portion extending along the second direction, multiple second sub-segments 7021 belonging to the same second compensation line 702 are successively arranged at intervals in the second direction, there is a gap between adjacent second sub-segments 7021, and the gap is traversed by a second sub-portion 4012 included in the first connecting portion 401.

With the above-mentioned arrangement where the second compensation line 702 traverses the display region 10 in the second direction, the first data line 301 forms a manner similar to double data line transmission, thereby further reducing a voltage drop of the first data line 301 in transmitting a data signal.

With the above-mentioned arrangement where two ends of each second sub-segment 7021 are coupled to a corresponding first data line 301, the resistance-capacitance load of the first data line 301 is effectively reduced, the voltage drop of the data signal transmitted by the first data line 301 is reduced, and the display uniformity of the display substrate is improved.

In the above-mentioned arrangement, in the case where the second compensation line 702 includes multiple second sub-segments 7021, there is a gap between adjacent second sub-segments 7021, and the gap is passed through by the first connecting portion 401, so that the connecting line 40 can connect a corresponding second data line 302 to the fan-out region 201 to realize coupling with a corresponding driving chip IC when mutual insulation is ensured between the connecting line 40 and the second compensation line 702.

Embodiments of the present disclosure also provide a display device including the display substrate provided by the above embodiments.

In an example, the display device includes a flexible display device.

In the display substrate provided in the above-mentioned embodiments, the second data line 302 is coupled to the corresponding connecting line 40, and the connecting line 40 extends from the second pixel region 102 to the first pixel region 101 and extends from the first pixel region 101 to the fan-out region 201, so as to realize coupling with the corresponding driving chip IC. Since the gap width between the first data line 301 and the connecting line 40 in the display substrate is small, both the first data line 301 and the connecting line 40 can extend from the first pixel region 101 to the fan-out region 201, so that both the first data line 301 and the connecting line 40 can exit at a small angle (an included angle with the second direction), reducing the extension range of the first data line 301 and the connecting line 40 in the fan-out region 201 along the first direction, thereby reducing the width of the fan-out region 201 in the second direction, and effectively reducing the width of the lower border of the display substrate.

Therefore, the display device provided by the embodiments of the present disclosure also has the above-mentioned advantageous effects when including the above-mentioned display substrate, and the description thereof will not be repeated herein.

It should be noted that the display device may be any product or component with a display function, such as a television, a display, a digital photo frame, a mobile phone, a tablet computer, etc. The display device further includes a flexible circuit board, a printed circuit board and a backboard, etc.

It should be noted that the "being in the same layer" in the embodiments of the present disclosure may refer to being in films in the same structural layer. Or, for example, the films in the same layer may be formed as follows: films used for forming specific patterns are formed through a single film forming process, then the films are patterned through a single patterning process by using the same mask. Depending on the particular patterns, a single patterning process may include multiple times of exposure, development, or etching, and the particular patterns in the resulting layer structure may or may not be continuous. The particular patterns may be at different heights or have different thicknesses.

In the method embodiments of the present disclosure, sequence numbers of various steps are not used to limit the order of the steps. For those of ordinary skill in the art, change of the order of the steps without any creative efforts also falls within the protection scope of the present disclosure.

It should be noted that the various embodiments in this specification are described in a progressive manner, each of which focuses on differences from the other embodiments, and reference may be made to each other for the same or similar parts between the various embodiments. In particular, the method embodiments are described more simply since they are substantially similar to the product embodiments, and reference may be made to descriptions in the product embodiments for the related parts.

Unless otherwise defined, technical terms or scientific terms used in the present disclosure shall have common meanings understood by those ordinary skilled in the art. Terms such as "first" and "second" in the present disclosure do not indicate any order, quantity or importance, and they are merely used to distinguish different components. Terms such as "include" or "have" indicate that an element or object before such terms covers an element, an object or the equivalent enumerated after such terms, and do not exclude other elements and objects. Terms such as "linked" "coupled", or "connected" are not limited to physical or mechanical connection, they may include direct or indirect electrical connection. Terms such as "above", "below", "left" and "right" are merely to describe relative position relationships, and if an absolute position of a described object changes, relative positions with respect to the described object may change correspondingly.

It can be understood that, if an element such as a layer, a film, a region or a substrate is described to be on or below another element, the element may be directly on or below the another element, or there may be an intermediate element between the element and the another element.

In the descriptions of the above embodiments, specific features, structures, materials, or characteristics may be combined in any one or more embodiments or examples in a suitable manner.

The above descriptions are merely specific implementations of the present disclosure, and the protection scope of the present disclosure is not limited thereto. For those of ordinary skill in the art, within the technical scope disclosed in the present disclosure, changes or substitutions can be made. These changes or substitutions shall fall with the protection scope of the present disclosure. Therefore, the protection scope of the present disclosure is determined by the claims.

What is claimed is:

1. A display substrate, comprising: a display region and a peripheral region surrounding the display region; wherein the display region comprises at least one group of pixel regions, the group of pixel regions comprises a first pixel region and two second pixel regions, and the first pixel region is located between the two second pixel regions in a first direction; wherein the peripheral region comprises a fan-out region, the fan-out region is located on a side of the first pixel region in a second direction, and the second direction intersects with the first direction;

wherein the display substrate further comprises:
a plurality of first data lines, wherein at least part of the first data line is located in the first pixel region, and the first data line comprises a part extending along the second direction;
a plurality of second data lines, wherein at least part of the second data line is located in the second pixel region, and the second data line comprises a part extending along the second direction; and
a plurality of connecting lines, wherein the connecting line is coupled with the corresponding second data line, the connecting line comprises a portion located in the first pixel region, and the connecting line extends from the first pixel region to the fan-out region.

2. The display substrate according to claim 1, wherein the connecting line comprises a first connecting portion and a second connecting portion coupled to each other;
the first connecting portion comprises a portion extending along the first direction, and the first connecting portion is coupled with the corresponding second data line; and
the second connecting portion comprises a portion extending along the second direction, at least part of the second connecting portion is located in the first pixel region, and the second connecting portion extends from the first pixel region to the fan-out region.

3. The display substrate according to claim 2, wherein:
the plurality of first connecting portions comprised in the plurality of connecting lines are arranged in the second direction, and two adjacent first connecting portions of the plurality of first connecting portions have substantially the same length; and/or,
the plurality of second connecting portions comprised in the plurality of connecting lines are arranged in the first direction, and two adjacent second connecting portions of the plurality of second connecting portions have substantially the same length.

4. The display substrate according to claim 2, wherein the first data line and the second data line are arranged in a same layer and made of a same material, the first connecting portion is located on a side of the second data line facing away from a base of the display substrate, and the second connecting portion is located on a side of the first connecting portion facing away from the base.

5. The display substrate according to claim 2, wherein the first connecting portion comprises a first sub-portion and a second sub-portion coupled with each other;
the first sub-portion comprises a portion extending along the second direction, and the first sub-portion is coupled with the corresponding second data line; and
the second sub-portion comprises a portion extending along the first direction, the second sub-portion is coupled to the second connecting portion.

6. The display substrate according to claim 5, wherein the first sub-portion traverses the display region in the second direction, the first sub-portion comprises at least one first sub-segment, two ends of the first sub-segment are coupled to the corresponding second data line, and the second sub-portion is coupled to one first sub-segment of the at least one first sub-segment; and
in a case that the first sub-portion comprises a plurality of first sub-segments, there is a gap between adjacent first sub-segments, and a second sub-portion comprised in another first connecting portion traverses the gap.

7. The display substrate according to claim 5, wherein the first connecting portion and the second connecting portion are arranged in a same layer and made of a same material, and the first connecting portion is arranged in a different layer from the second data line.

8. The display substrate according to claim 7, wherein the first sub-portion and the corresponding second data line are coupled through at least one via hole; in a case that the first sub-portion and the corresponding second data line are coupled through a plurality of via holes, the plurality of via holes is arranged along the second direction.

9. The display substrate according to claim 2, wherein the first data line extends from the first pixel region to the fan-out region.

10. The display substrate according to claim 2, further comprising:
a plurality of first extension lines, wherein the first extension line is coupled to the corresponding first data line, the first extension line extends from the first pixel region to the fan-out region, and the first extension line and the second connecting portion are arranged in a same layer and made of a same material.

11. The display substrate according to claim 2, further comprising:
a plurality of compensation lines, wherein the compensation line comprises a portion located in the first pixel region, and the compensation line is coupled to the corresponding first data line.

12. The display substrate according to claim 11, wherein a length of the compensation line is substantially the same as a length of the adjacent first connecting portion.

13. The display substrate according to claim 11, wherein the plurality of compensation lines comprises a plurality of first compensation lines, the first compensation line comprises a portion extending in the first direction, the first compensation lines are spaced apart from the first connecting portions in the second direction.

14. The display substrate according to claim 11, wherein the compensation line and the first connecting portion are in a same layer and made of a same material.

15. The display substrate according to claim 14, wherein the plurality of compensation lines comprises a plurality of second compensation lines, the second compensation line traverses the display region in the second direction, the second compensation line comprises at least one second sub-segment, and two ends of the second sub-segment are coupled to the corresponding first data line; and
in a case that the second compensation line comprises a plurality of second sub-segments, there is a gap between adjacent second sub-segments, and the gap is traversed by the first connecting portion.

16. A display device, comprising a display substrate, wherein the display substrate comprises: a display region and a peripheral region surrounding the display region; wherein the display region comprises at least one group of pixel regions, the group of pixel regions comprises a first pixel region and two second pixel regions, and the first pixel region is located between the two second pixel regions in a first direction; wherein the peripheral region comprises a fan-out region, the fan-out region is located on a side of the first pixel region in a second direction, and the second direction intersects with the first direction;

wherein the display substrate further comprises:
a plurality of first data lines, wherein at least part of the first data line is located in the first pixel region, and the first data line comprises a part extending along the second direction;
a plurality of second data lines, wherein at least part of the second data line is located in the second pixel region, and the second data line comprises a part extending along the second direction; and
a plurality of connecting lines, wherein the connecting line is coupled with the corresponding second data line, the connecting line comprises a portion located in the first pixel region, and the connecting line extends from the first pixel region to the fan-out region.

17. The display device according to claim 16, wherein the connecting line comprises a first connecting portion and a second connecting portion coupled to each other;
the first connecting portion comprises a portion extending along the first direction, and the first connecting portion is coupled with the corresponding second data line; and
the second connecting portion comprises a portion extending along the second direction, at least part of the second connecting portion is located in the first pixel region, and the second connecting portion extends from the first pixel region to the fan-out region.

18. The display device according to claim 17, wherein:
the plurality of first connecting portions comprised in the plurality of connecting lines are arranged in the second direction, and two adjacent first connecting portions of the plurality of first connecting portions have substantially the same length; and/or,
the plurality of second connecting portions comprised in the plurality of connecting lines are arranged in the first direction, and two adjacent second connecting portions of the plurality of second connecting portions have substantially the same length.

19. The display device according to claim 17, wherein the first data line and the second data line are arranged in a same layer and made of a same material, the first connecting portion is located on a side of the second data line facing away from a base of the display substrate, and the second connecting portion is located on a side of the first connecting portion facing away from the base.

20. The display device according to claim 17, wherein the first connecting portion comprises a first sub-portion and a second sub-portion coupled with each other;
the first sub-portion comprises a portion extending along the second direction, and the first sub-portion is coupled with the corresponding second data line; and
the second sub-portion comprises a portion extending along the first direction, the second sub-portion is coupled to the second connecting portion.

\* \* \* \* \*